United States Patent
Eschauzier et al.

(10) Patent No.: US 6,583,669 B1
(45) Date of Patent: Jun. 24, 2003

(54) APPARATUS AND METHOD FOR A COMPACT CLASS AB TURN-AROUND STAGE WITH LOW NOISE, LOW OFFSET, AND LOW POWER CONSUMPTION

(75) Inventors: Rudy G. H. Eschauzier, Bergschenhoek (NL); Nico van Rijn, Kaiwijk (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/118,545

(22) Filed: Apr. 8, 2002

(51) Int. Cl.$^7$ ................................................ H03F 3/45
(52) U.S. Cl. ...................................... 330/255; 330/264
(58) Field of Search ................................. 330/255, 264, 330/253, 257

(56) References Cited

U.S. PATENT DOCUMENTS

| | | | |
|---|---|---|---|
| 4,532,479 A | 7/1985 | Blauschild | 330/261 |
| 4,829,266 A * | 5/1989 | Pernici et al. | 330/253 |
| 5,113,148 A * | 5/1992 | Theus | 330/253 |
| 5,177,450 A * | 1/1993 | Lee et al. | 330/253 |
| 5,471,172 A | 11/1995 | Chiu et al. | 330/253 |
| 5,515,006 A * | 5/1996 | Chan | 330/255 |
| 5,523,718 A | 6/1996 | Butler | 330/255 |
| 5,907,262 A | 5/1999 | Graeme et al. | 330/255 |
| 5,982,230 A | 11/1999 | MacBeth | 330/9 |
| 6,043,708 A | 3/2000 | Barr | 330/253 |
| 6,052,025 A | 4/2000 | Chang et al. | 330/253 |
| 6,236,270 B1 | 5/2001 | Takeuchi | 330/253 |
| 6,380,801 B1 | 4/2002 | McCartney | 330/9 |
| 6,433,637 B1 | 8/2002 | Sauer | 330/255 |

* cited by examiner

*Primary Examiner*—Henry Choe
(74) *Attorney, Agent, or Firm*—Merchant & Gould, P.C.; Joshua W. Korver

(57) ABSTRACT

A turn-around stage is provided that accepts the full current swing from an input stage while maintaining a low quiescent current. The circuitry provides Class AB operation with quiescent currents that are significantly less than the maximum signal current so that overall power consumption is significantly reduced. Also, the amount of noise and offset contributions of the circuit are reduced by reducing the transconductances associated with transistors included in the turn-around stage.

10 Claims, 4 Drawing Sheets

US 6,583,669 B1

APPARATUS AND METHOD FOR A COMPACT CLASS AB TURN-AROUND STAGE WITH LOW NOISE, LOW OFFSET, AND LOW POWER CONSUMPTION

FIELD OF THE INVENTION

The present invention relates to the field of amplifiers, and in particular, to a compact turn-around stage with Class AB behavior, low power consumption, low noise and improved offset performance.

BACKGROUND OF THE INVENTION

An integrated amplifier circuit such as an opamp is usually constructed from a small chip of semiconductor material upon which an array of active/passive components have been constructed and connected together to form a functioning circuit. An integrated amplifier circuit is generally encapsulated in a plastic housing (chip) with signal, power supply, and control pins accessible for connection to external electronic circuitry. Typically, input signals transmitted to the integrated amplifier circuit via selected input pins are processed by active and passive components in different stages, e.g., input and turn-around, and the processed signals are then applied to selected output pins using an output stage.

The enormous growth of high-speed communication and high data rate image processing applications, requiring high-speed, low power and small size, has created a demand for miniaturized high-speed amplifiers that can operate at low voltages. To maximize the dynamic range at low supply voltages for this use, it is desirable that the output voltage range for this type of amplifier should be as large as possible. Preferably, the output voltage range of the amplifier would extend from one rail to the other rail of the power supply.

Class-AB circuitry is used in amplifiers that employ both bipolar and/or MOS components. A Class AB circuit can deliver to and pull from a load a current that is larger than the DC quiescent current flowing into the circuit. Class AB circuitry is preferred in output stage of a low-power high speed amplifier because it improves power efficiency by maximizing the output drive current with a relatively low quiescent current. For example, the drive current for a Class AB circuit might be 100 milliamps and the quiescent current could be 1 milliamps. Also, Class AB circuitry exhibits good linearity over the entire output voltage range.

A turn-around or level-shift stage is an often neglected, but crucial part of an amplifier. Its main purpose is providing a level shift function, such that the input common mode voltage range of the amplifier is independent of the output voltage. Because the turn-around stage often directly follows an input stage, the supply current for the turn-around stage often needs to be high enough to compensate for the total current swing of the input stage. In addition, the turn-around stage is usually an important contributor to input non-ideal parameters such as offset and noise. In many cases, the turn-around stage can be the dominant factor for these parameters, and sometimes even more so than the input stage itself.

SUMMARY OF THE INVENTION

In accordance with the invention, an apparatus for an operational amplifier with reduced quiescent current requirements, and therefore reduced offset and noise contributions, is provided. An input stage is adapted for receiving an input signal.

Briefly described, a turn-around stage is provided that accepts the full current swing from an input stage while maintaining a low quiescent current. The circuitry provides Class AB operation with quiescent currents that are significantly less than the maximum signal current so that overall power consumption is significantly reduced. Also, the amount of noise and offset contributions of the circuit are reduced by reducing the transconductances associated with transistors included in the turn-around stage.

In addition, the transconductance associated with various transistors included in the turn-around stage are reduced by reducing the power consumption of the turn-around stage. High transconductance values contribute to high offset and noise values for an amplifier. By reducing the power consumption of the turn-around stage, the adverse effects of offset and noise in the amplifier are minimized.

Also, the turn-around stage described herein is configured to operate at a lower operating current than the input stage, while retaining the ability to accept large signal currents from the input stage. Thus, the quiescent current supplied to the turn-around stage is not required to be commensurate with the signal currents from the input stage.

Additionally, the open loop gain for the amplifier is increased by reducing the quiescent current that is consumed by the turn-around stage. In particular, when the quiescent currents of certain transistors are reduced, their output impedance increases, and results in increased open loop gain.

The invention may also be implemented as methods that perform substantially the same functionality as the embodiments of the invention discussed above and below.

These and other features as well as advantages, which characterize the invention, will be apparent from a reading of the following detailed description and a review of the associated drawings.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The invention is related to amplifiers that employ a class AB turn-around stage. A differential input stage is coupled to the turn-around stage. The turn-around stage accepts the full current swing from the input stage while maintaining a low quiescent current. The turn-around stage also has a slew rate that is commensurate with conventional turn-around stages. The turn-around stage is compact in comparison to conventional turn-around stages and provides Class AB behavior with relatively few and minimum sized components. The turn-around stage also provides Class AB operation with reduced power consumption by operating with quiescent currents that are significantly less than the maximum output signal current. Also, the amount of noise is reduced and the offset performance of the circuit is improved by reducing the transconductance of transistors within the turn-around stage as a result of the low quiescent current.

Figure 1:
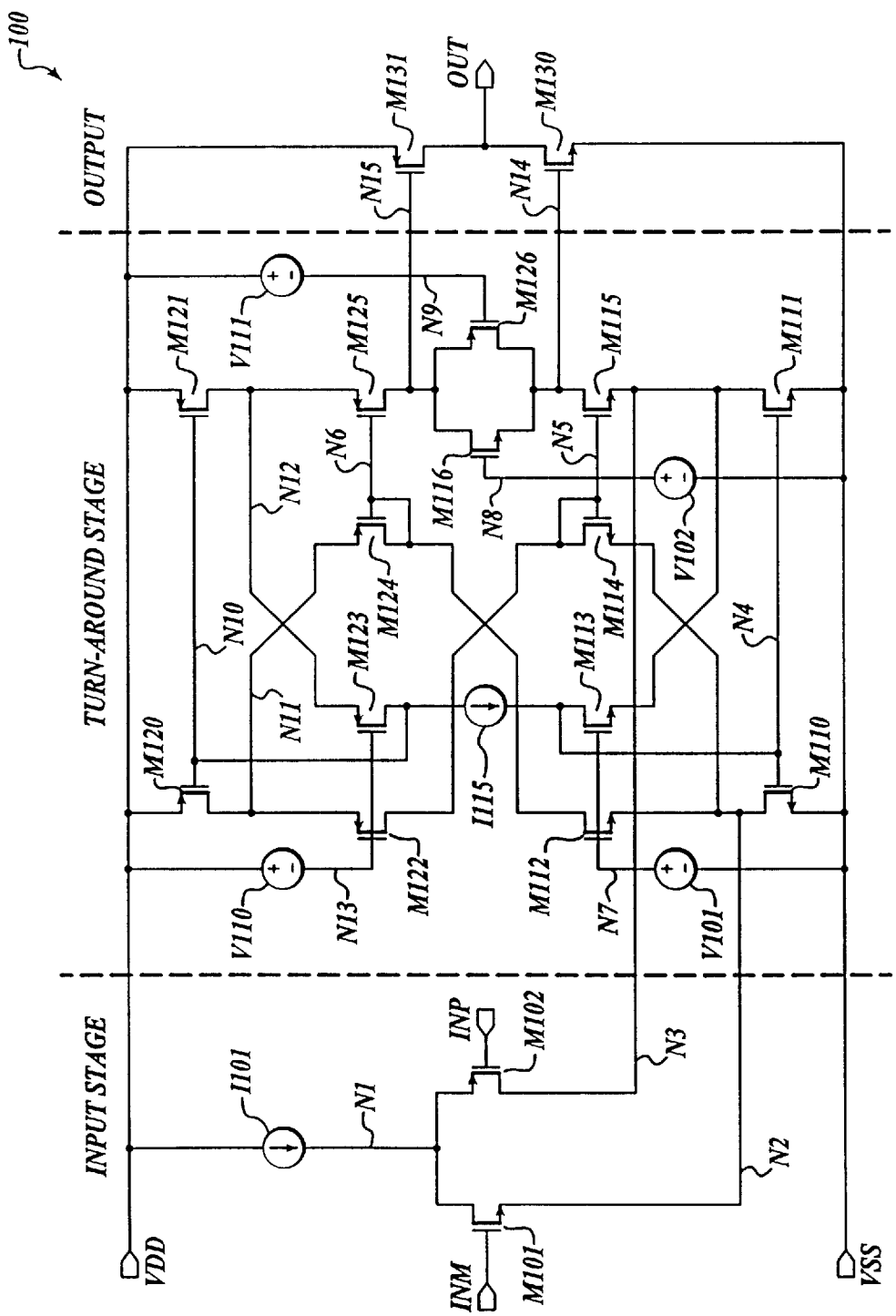
FIG. 1 illustrates a schematic diagram of an electronic circuit with a turn-around stage.

FIG. 1 shows a schematic diagram of an electronic circuit (100) that includes an input stage coupled to a turn-around stage. The input stage includes MOS-type input transistors M101 and M102, and current source I101. The turn-around stage includes MOS-type transistors M110–M116, M120–126 and M130–131, floating current source I115, and voltage sources V101, V102, V110, and V111.

The input stage is represented by differentially-connected input transistors M101 and M102. Input transistor M101 includes a gate that is coupled to a first differential input terminal (INM), a source that is coupled to node N1, and a drain that is coupled to node N2. Input transistor M102 includes a gate that is coupled to a second differential input terminal (INP), a source that is coupled to node N1, and a drain that is coupled to node N3. Current source I101 is coupled between the high side of the supply voltage (i.e., high power supply) (VDD) and node N1.

The turn-around stage includes two sections, a lower section and an upper section, that are similar in arrangement. The lower section includes transistors M110–M116 and voltage sources V101 and V102. The upper section includes transistors M120–M126 and voltage sources V110 and V111. The turn-around stage also includes output transistors M130 and M131, and a floating current source I115.

In the lower section, transistor M110 includes a gate that is coupled to node N4, a source that is coupled to the low side of the supply voltage (i.e., low power supply) (VSS), and a drain that is coupled to node N2. Transistor M111 includes a gate that is coupled to node N4, a source that is coupled to VSS, and a drain that is coupled to node N3. Transistor M112 includes a gate that is coupled to node N7, a source that is coupled to node N2, and a drain that is coupled to node N6. Voltage source V101 is coupled between node N7 and VSS. Transistor M113 includes a gate that is coupled to node N7, a source that is coupled to node N2, and a drain that is coupled to node N4. Transistor M114 includes a source that is coupled to node N2, and a gate and drain that are coupled to node N5. Transistor M115 includes a gate that is coupled to node N5, a source that is coupled to node N3, and a drain that is coupled to node N14. Transistor M116 includes a gate that is coupled to node N8, a source that is coupled to node N14, and a drain that is coupled to node N15. Voltage source V102 is coupled between node N8 and VSS.

In the upper section, transistor M120 includes a gate that is coupled to node N10, a source that is coupled to VDD, and a drain that is coupled to node N11. Transistor M121 includes a gate that is coupled to node N10, a source that is coupled to VDD, and a drain that is coupled to node N12. Transistor M122 includes a gate that is coupled to node N13, a source that is coupled to node N11, and drain that is coupled to node N5. Voltage source V110 is coupled between node N13 and VDD. Transistor M123 includes a gate that is coupled to node N13, a source that is coupled to node N12, and a drain that is coupled to node N10. Transistor M124 includes a source that is coupled to node N11, and a gate and drain that are coupled to node N6. Transistor M125 includes a gate that is coupled to node N6, a source that is coupled to node N12, and a drain that is coupled to node N15. Transistor M126 includes a gate that is coupled to node N9, a source that is coupled to node N15, and a drain that is coupled to node N14.

Output transistor M130 includes a gate that is coupled to node N14, a source that is coupled to VSS, and a drain that is coupled to an output terminal (OUT). Output transistor M131 includes a gate that is coupled to node N15, a source that is coupled to VDD, and a drain that is coupled to the output terminal (OUT).

In operation, the differentially connected input transistors (M101, M102) receive signals INM and INP. Input transistors M101 and M102 are configured to operate as a differential pair. The input transistors (M101, M102) and the current source (I101) operate as an input stage that is configured to route source currents from current source I101 to nodes N2 and N3. The amount of current steered (or routed) to nodes N2 and N3 is determined by the difference between signals INP and INM.

For the purposes of discussion, values for an amount of current are represented by the character "I" in the figures discussed here and below. In one example, the differential input signal causes the input stage to be tilted (INP pulled low and INM pulled high) so that input transistor M102 is activated and input transistor M101 is deactivated. The current (e.g., "2I") from current source I101 is routed through input transistor M102 into node N3. The current (e.g., "2I") flowing into node N3 increases the voltage at the source of transistor M113, the source of transistor M115, and the drain of transistor M111. Transistors M113 and M111 are arranged in a first feedback loop to ensure that the current (i.e., "2I") entering node N3 is absorbed by transistor M111. Transistor M113 is deactivated in response to the increase in voltage at its source, and the potential at node N4 is pulled up via floating current source I115 such that transistors M110 and M111 are activated. The gate-source voltage of transistor M110 is equal to the gate-source voltage of transistor M111. Accordingly, the current (e.g., "2I") flowing through transistor M111 is mirrored through transistor M110 when the transistors (M110,M111) are activated. The voltage at node N2 is pulled down by transistor M110, while active. The gate of transistor M112 is biased by voltage source V101. The gate-source voltage of transistor M112 therefore increases in response to the current (e.g., "2I") flowing through transistor M110. Transistor M114 is biased at a constant current, and therefore has a constant gate-source voltage. Thus, the voltage at node N5 (the gate of transistor M114) decreases in response to a decrease in the voltage at node N2 (the source of transistor M114). The decrease in voltage at node N5 decreases the gate voltage of transistor M115. The gate-source voltage of transistor M115 decreases by an amount corresponding to the increase in gate-source voltage of transistor M112. Transistor M115 is deactivated when it's gate-source voltage decreases below a specified threshold.

In one embodiment, the relationship between the currents flowing through transistor M112 and transistor M115 is described by the following equation:

$$\sqrt{I_{M112}} + \sqrt{I_{M115}} = C \quad (1)$$

where C is a constant. This relationship holds when both transistors (M112, M115) are in strong inversion and the maximum current through transistors M112 and M115 is limited by their available gate-source voltages.

Transistor M112 pulls down the voltage at node N6 such that transistor M125 is activated when transistor M112 is active. Transistor M121 and transistor M123 are arranged in a second feedback loop to ensure that the voltage at node N12 (the source of transistor M125) remains constant. Since the source of transistor M125 is held constant, the current through transistor M120 increases in response to the decrease in voltage at node N6. The current flowing through transistor M120 is mirrored to transistor M121.

Transistors M116 and M126 are biased by their respective voltage sources (V102,V111) to operate as a resistive circuit. Other resistive circuits may be employed in place of transistors M116 and M126, and voltage sources V102 and V111 as necessary. The current (e.g., "2I") flowing through transistor M121 passes through transistor M125 and the parallel combination of transistors M116 and M126 such that the voltages at the drive points of the turn-around stage (node N15 and node N14) increase. Output transistor M131 is deactivated in response to an increased voltage at node N15. Output transistor M130 is activated in response to an increased voltage at node N14. Transistor M130 is arranged to pull current from the output terminal (OUT) when active.

When the differential input signal causes the input stage to be tilted in the opposite direction (INP pulled high and INM pulled low), input transistor M101 is activated and input transistor M102 is deactivated. The current (e.g., "2I") from current source I101 is routed through input transistor M101 into node N2. The current (e.g., "2I") flowing into node N2 increases the voltage at the drain of transistor M110, the source of transistor M112, and the source of transistor M114. Transistors M114,M115, M113 and M110 are arranged in a third feedback loop to ensure that the current (e.g., "2I") entering node N2 is absorbed by transistor M110. The current (e.g., "2I") flowing through transistor M110 is mirrored through transistor M111. Current is pulled through transistor M113 in response to the current flowing through transistor M111. As previously stated, the voltage at the source of transistor M112 increases in response to the current (e.g., "2I") flowing through the third feedback loop (M114, M115, M113 and M110). Accordingly, the gate-source voltage of transistor M112 decreases when the voltage at node N2 increases. The voltage at node N5 increases in response to the increase at node N2 since the gate-source voltage of transistor M114 is constant. The gate voltage of transistor M115 increases when the voltage at node N5 increases. The gate-source voltage of transistor M115 increases by an amount corresponding to the decrease in gate-source voltage of transistor M112. Transistor M115 is activated when it's gate-source voltage increases above a specified threshold. In one embodiment, the same relationship as in (1) holds between the currents flowing through transistors M112 and M115.

The same class-AB behavior exists in the upper section of the turn-around stage, with a fourth feedback loop through transistors M124, M125, M123, and M120. The voltage at the gates of transistors M124 and M125 (i.e., node N6) increases in response to the current flowing through the fourth feedback loop (M124, M125, M123, M120). Transistor M125 is deactivated when the voltage at node N6 increases.

Again, transistors M116 and M126 are biased by their respective voltage sources (V102, V111) to operate as a resistive circuit. The current (e.g., "2I") flowing through transistor M111 pulls current through active transistor M115 and the parallel combination of transistors M116 and M126 such that the voltages at the drive points of the turn-around stage (node N15 and node N14) decrease. Output transistor M130 is deactivated in response to the increased voltage at node N14. Output transistor M131 is activated in response to the decreased voltage at node N15. Transistor M131 is arranged to push current into the output terminal (OUT) when active.

Figure 2:
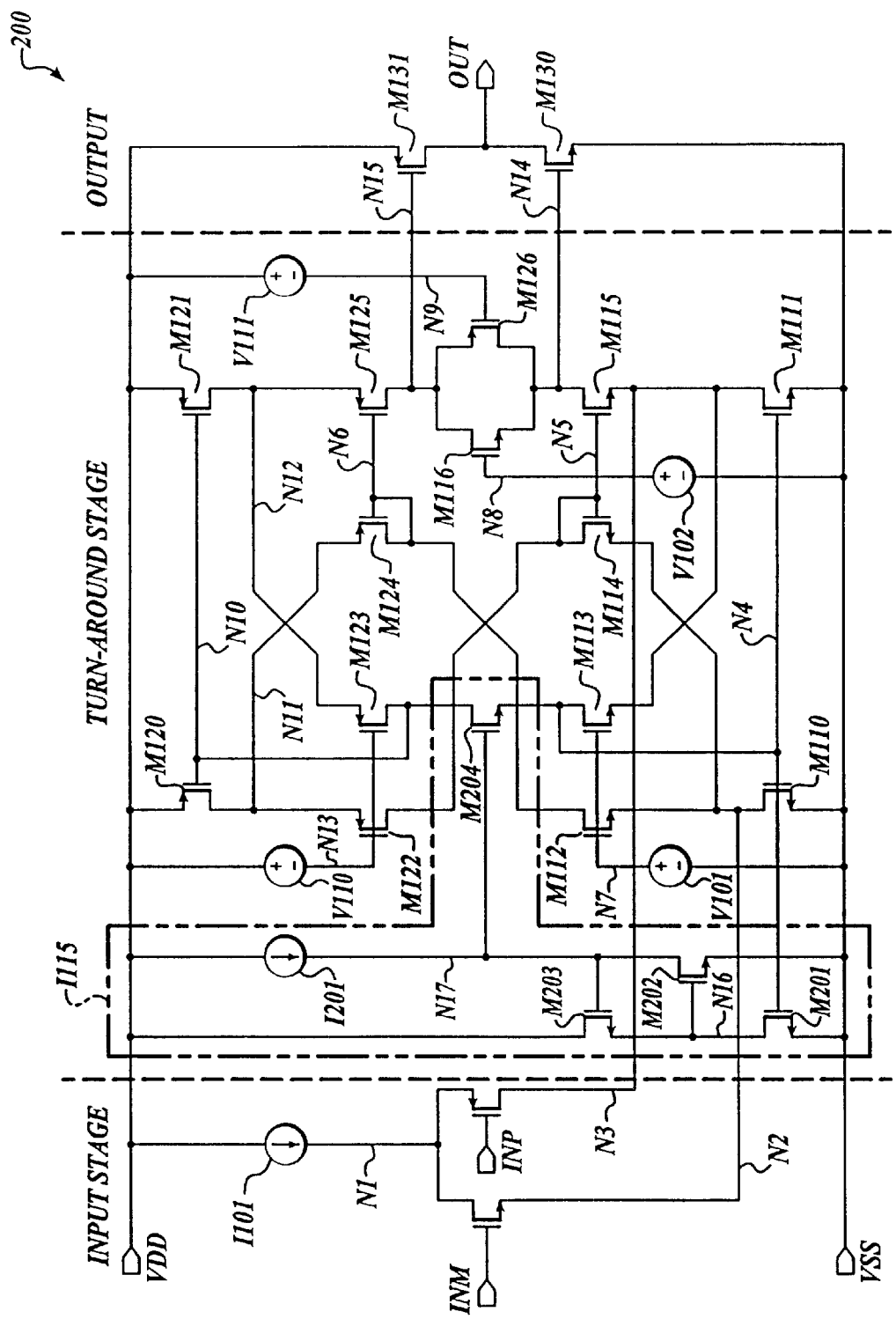
FIG. 2 shows another schematic diagram of the electronic circuit with the turn-around stage illustrating a floating current source in greater detail.

FIG. 2 shows another schematic diagram of an electronic circuit (200) similar to the electronic circuit (100) of FIG. 1 with the floating current source (I115) shown in greater detail. The electronic circuit (200) is connected and operates similar to the electronic circuit (100) shown in FIG. 1. The circuitry for the floating current source (I115) shown in FIG. 1 includes MOS-type transistors M201–M204 and single-ended current source I201.

Transistor M201 includes a gate that is coupled to node N4, a source that is coupled to node N16, and a drain that is coupled to VSS. Transistor M202 includes a gate that is coupled to node N16, a source that is coupled to VSS, and a drain that is coupled to node N17. Transistor M203 includes a gate that is coupled to node N17, a source that is coupled to node N16, and a drain that is coupled to VDD. Transistor M204 includes a gate that is coupled to node N17, a source that is coupled to node N4, and a drain that is coupled to node N10. Single-ended current source I201 is coupled between VDD and node N17.

In operation, the gate voltage of transistor M204 is set by the sum of the gate-source voltages of transistors M202 and M203. The source voltage of transistor M204 is set by the gate-source voltage of transistor M201. Transistor M202 is biased at a constant current by single-ended current source I201, resulting in transistor M202 having a constant gate-source voltage. Accordingly, a change in voltage at the gate of transistor M201 is transferred into a voltage change at the gates of transistors M203 and M204. Transistor M204 operates as a floating current source since the gate voltage of transistor M204 changes when it's source voltage changes.

The electronic circuit (200) shown in FIG. 2 corresponds to the electronic circuit (100) shown in FIG. 1, with further details for floating current source (I115). The supply voltage requirements of the turn-around stage are minimized by this implementation.

The minimum supply voltage requirements for proper operation of the turn around stage are determined by analyzing various voltage requirements for transistors M120, M204 and M110. Transistor M120 requires a gate-source voltage that is less than it's threshold potential (i.e., −1V) for active operation. Transistor M110 requires a gate-source voltage that is greater than it's threshold potential (i.e., +1V) for active operation. Transistor M204 is arranged to operate as a constant current source, such that transistor M204 requires a drain-source voltage that is at least equal to the saturation voltage (i.e., 200 mV) of transistor M204 for active operation. The minimum supply voltage requirements (i.e., the difference between VDD and VSS) are determined as the threshold voltages of transistors M110 and M120, and the saturation voltage of transistor M204 (i.e., 2.2V=1+1+ 0.2).

The transconductance associated with various transistors included in the turn-around stage, such as transistors M110, M111, M120, and M121, are reduced by reducing the power consumption of the turn-around stage. High transconductance values contribute to high offset and noise values for an amplifier. For example, an offset or noise voltage from transistor M110 and M111 is transferred into the input of an amplifier by multiplying the offset or noise voltage with the ratio of the transconductances of transistors M110/M111 and transistors M101/M102. Therefore, by reducing the power consumption of the turn-around stage, the adverse effects of offset and noise in the amplifier are minimized.

The turn-around stage described herein is configured to operate at a lower operating current than the input stage, while retaining the ability to accept large signal currents from the input stage. For example, signal currents from the input stage upwards of 100 $\mu$A may be delivered to the turn around stage, while 1 $\mu$A of quiescent current is flowing through the turn-around stage. Thus, the quiescent current supplied to the turn-around stage is not required to be commensurate with the signal currents from the input stage.

Additionally, the open loop gain for the amplifier is increased by reducing the quiescent current that is consumed by the turn-around stage. In particular, the quiescent currents of transistors M115 and M125 are reduced according to the present invention, increasing their output impedance, and resulting in increased open loop gain.

Figure 3:
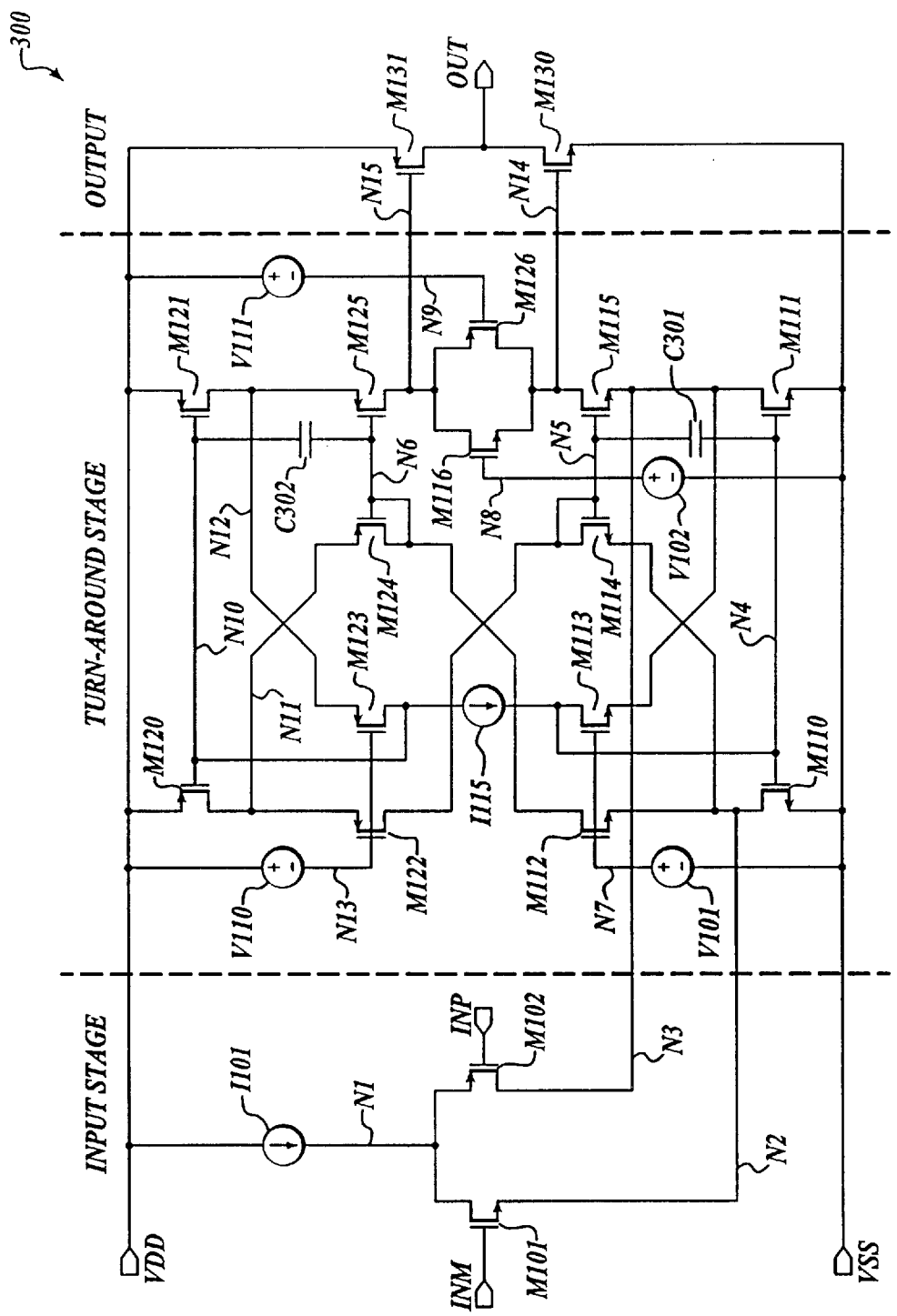
FIG. 3 illustrates a schematic diagram of an alternative embodiment for the electronic circuit with the turn-around stage.

FIG. 3 illustrates a schematic diagram of an alternative embodiment (300) for the electronic circuit with the turn-around stage. The alternative embodiment (200) is connected and operates similar to the electronic circuit (100) shown in FIG. 1. The alternative embodiment includes capacitors C301 and C302 coupled across the feedback loops described in connection with FIG. 1.

Capacitor C301 is coupled between node N5 and node N4. Capacitor C302 is coupled between node N6 and node N10. Each capacitor (C301 and C302) provides additional stability for the third feedback loop (M114, M115, M113 and M110) and fourth feedback loop (M124, M125, M123, and M120) described in connection with FIG. 1 respectively. The third and fourth feedback loops have a high gain associated with their operation. Accordingly, a capacitor may be used to stabilize each feedback loop and reduce voltage fluctuations. The size of capacitors C301 and C302 are relatively small such that they require minimal die area when provided in an integrated circuit.

Figure 4:
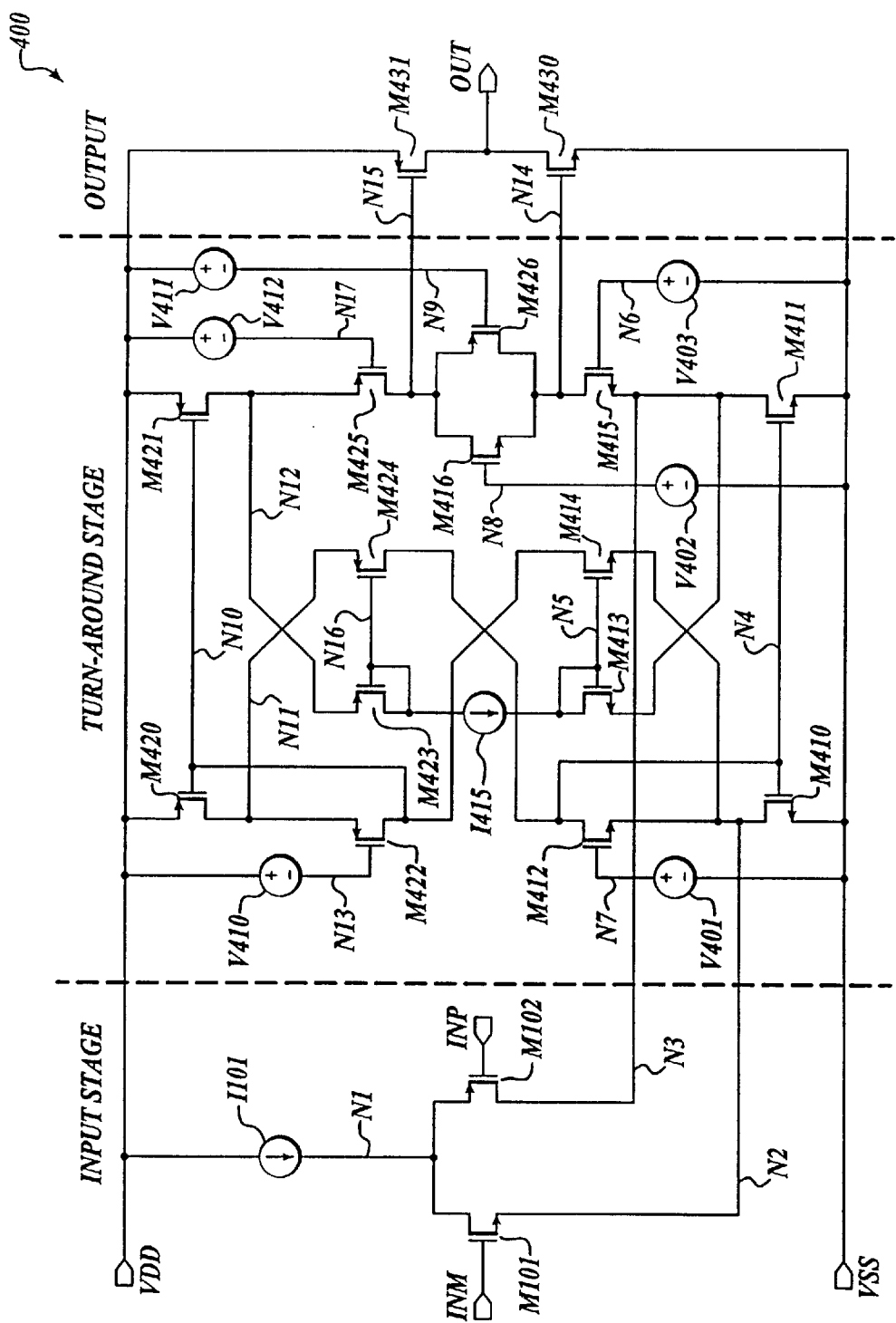
FIG. 4 shows a schematic diagram of another alternative embodiment for electronic circuit with the turn-around stage, in accordance with the present invention.

FIG. 4 shows a schematic diagram of another alternative embodiment (400) for electronic circuit with a turn-around stage. The alternative embodiment (200) operates similar to the electronic circuit (100) shown in FIG. 1. The alternative embodiment (400) removes the high gain feedback loops (feedback loops three and four) of the electronic circuit (100) shown in FIG. 1 to increase the stability of the turn-around stage while avoiding the use of capacitors (C301 and C302) as described in FIG. 3.

The input stage is connected similar to the input stage illustrated in FIG. 1.

The turn-around stage in FIG. 4 includes two sections, a lower section and an upper section, similar to the turn-around stage shown in FIG. 1. The lower section in FIG. 4 includes transistors M410–M416 and voltage sources V401–V403. The upper section includes transistors M420–M426 and voltage sources V410, V411, and V412. The turn-around stage also includes output transistors M430 and M431, and a floating current source I415.

In the lower section, transistor M410 includes a gate that is coupled to node N4, a source that is coupled to the low side of the supply voltage (VSS), and a drain that is coupled to node N2. Transistor M411 includes a gate that is coupled to node N4, a source that is coupled to VSS, and a drain that is coupled to node N3. Transistor M412 includes a gate that is coupled to node N7, a source that is coupled to node N2, and a drain that is coupled to node N4. Voltage source V401 is coupled between node N7 and VSS. Transistor M413 includes a source that is coupled to node N3, and a gate and drain that are coupled to node N5. Transistor M414 includes a gate that is coupled to node N5, a source that is coupled to node N2, and a drain that is coupled to node N10. Transistor M415 includes a gate that is coupled to node N6, a source that is coupled to node N3, and a drain that is coupled to node N14. Voltage source V403 is coupled between node N6 and VSS. Transistor M416 includes a gate that is coupled to node N8, a source that is coupled to node N14, and a drain that is coupled to node N15. Voltage source V402 is coupled between node N8 and VSS.

In the upper section, transistor M420 includes a gate that is coupled to node N10, a source that is coupled to VDD, and a drain that is coupled to node N11. Transistor M421 includes a gate that is coupled to node N10, a source that is coupled to VDD, and a drain that is coupled to node N12. Transistor M422 includes a gate that is coupled to node N13, a source that is coupled to node N11, and drain that is coupled to node N10. Voltage source V410 is coupled between node N13 and VDD. Transistor M423 includes a source that is coupled to node N12, and a gate and drain that are coupled to node N16. Transistor M424 includes a gate that is coupled to node N16, a source that is coupled to node N11, and a drain that is coupled to node N4. Transistor M425 includes a gate that is coupled to node N17, a source that is coupled to node N12, and a drain that is coupled to node N15. Transistor M426 includes a gate that is coupled to node N9, a source that is coupled to node N15, and a drain that is coupled to node N14.

Output transistor M430 includes a gate that is coupled to node N14, a source that is coupled to VSS, and a drain that is coupled to an output terminal (OUT). Output transistor M431 includes a gate that is coupled to node N15, a source that is coupled to VDD, and a drain that is coupled to the output terminal (OUT).

In operation, the alternative embodiment (400) operates similar to the electronic circuit (100) of FIG. 1, however stability has been increased in the alternative embodiment (400) by eliminating the high gain feedback loops (feedback loops 3 and 4) of the electronic circuit (100) shown in FIG. 1. As a consequence, the minimum required supply voltage has also been increased. However, the alternative embodiment (400) in FIG. 4 allows for increased stability while avoiding the use of capacitors which can be undesirable for certain applications.

The minimum supply voltage requirements for proper operation of turn around stage 400 are determined by analyzing the voltage requirements for transistors M421, M423, M413, M411, and, floating current source I415. Transistor M421 requires a drain-source voltage that is at least equal to the saturation voltage (i.e., −200 mV) for active operation. Transistor M423 requires a gate-source voltage that is less than it's threshold potential (i.e., −1V) for active operation. Transistor M413 requires a gate-source voltage that is greater than it's threshold potential (i.e., +1V) for active operation. Transistor M411 requires a drain-source voltage that is at least equal to the saturation voltage (i.e., +200 mV) for active operation. As discussed previously with respect to FIG. 2, floating current source I415 may have a minimum operating voltage such as a saturation voltage of a transistor (i.e., +200 mV). The minimum supply voltage requirements (i.e., the difference between VDD and VSS) are determined as the threshold voltages of transistors M423, M413, the saturation voltages of transistors M421, M411, and the saturation voltage of floating current source I415 (i.e., 2.6V=1 +1+0.2+0.2+0.2).

The above specification, examples and data provide a complete description of the manufacture and use of the composition of the invention. Since many embodiments of the invention can be made without departing from the spirit and scope of the invention, the invention resides in the claims hereinafter appended.

We claim:

1. A class AB amplifier that operates from a high power supply and a low power supply, comprising:
   a first transistor having a gate terminal that is coupled to a first node, a source terminal that is coupled to the low power supply, and a drain terminal that is coupled a second node;
   a second transistor having a gate terminal that is coupled to the first node, a source terminal that is coupled to the low power supply, and a drain terminal that is coupled to a third node;
   a third transistor having a gate terminal that is coupled to a fourth node, a source terminal that is coupled to the second node, and a drain terminal that is coupled to a fifth node;
   a fourth transistor having a gate terminal that is coupled to the fourth node, a source terminal that is coupled to the third node, and a drain terminal that is coupled to the first node;
   a fifth transistor having a gate terminal that is coupled to a sixth node, a source terminal that is coupled to the second node, and a drain terminal that is coupled to the sixth node;
   a sixth transistor having a gate terminal that is coupled to the sixth node, a source terminal that is coupled to the third node, and a drain terminal that is coupled to a seventh node;
   a seventh transistor having a gate terminal that is coupled to an eighth node, a source terminal that is coupled to the high power supply, and a drain terminal that is coupled to a ninth node;
   an eighth transistor having a gate terminal that is coupled to the eighth node, a source terminal that is coupled to the high power supply, and a drain terminal that is coupled to a tenth node;
   a ninth transistor having a gate terminal that is coupled to an eleventh node, a source terminal that is coupled to the ninth node, and a drain terminal that is coupled to the sixth node;
   a tenth transistor having a gate terminal that is coupled to the eleventh node, a source terminal that is coupled to the tenth node, and a drain terminal that is coupled to the eighth node;
   an eleventh transistor having a gate terminal that is coupled to the fifth node, a source terminal that is coupled to the ninth node, and a drain terminal that is coupled to the fifth node;
   a twelfth transistor having a gate terminal that is coupled to the fifth node, a source terminal that is coupled to the tenth node, and a drain terminal that is coupled to a twelfth node;
   a floating current source that is coupled between the first node and the eighth node; and
   a resistive circuit that is coupled between the seventh node and the twelfth node, wherein the second and third nodes are arranged to operate as inputs to a class AB turn-around stage, and the seventh and twelfth nodes operate as drive points for an output of the class AB turn-around stage.

2. The class AB amplifier of claim 1, further comprising a differential input stage that is arranged to route a first source current to the second node and a second source current to the third node in response to a differential input signal.

3. The class AB amplifier of claim 1, further comprising:
   a first output transistor having a gate that is coupled to the seventh node, a source that is coupled the lower power supply, and a drain that is coupled to an output terminal such that the first output transistor pulls current from the output terminal when a first source current is driven into the third node; and
   a second output transistor having a gate that is coupled to the twelfth node, a source that is coupled to the high power supply, and a drain that coupled to the output terminal such that the second output transistor pushes current into the output when a second source current is driven into the second node.

4. The class AB amplifier of claim 1, wherein the floating current source comprises:
   a single-ended current source coupled between the high power supply and a thirteenth node;
   a thirteenth transistor having a gate terminal that is coupled to the first node, a source terminal that is coupled to the low power supply, and a drain terminal that is coupled to a fourteenth node;
   a fourteenth transistor having a gate terminal that is coupled to the fourteenth node, a source terminal that is coupled to the low power supply, and a drain terminal that is coupled to the thirteenth node;
   a fifteenth transistor having a gate terminal that is coupled to the thirteenth node, a source terminal that is coupled to the fourteenth node, and a drain terminal that is coupled to the high power supply; and
   a sixteenth transistor having a gate terminal that is coupled to the thirteenth node, a source terminal that is coupled to the first node, and a drain terminal that is coupled to the eighth node such that a voltage at the gate of the sixteenth transistor changes when a voltage at the source of the sixteenth transistor changes.

5. The class AB amplifier of claim 1, further comprising:
   a first capacitor that is coupled between the first node and the sixth node; and
   a second capacitor coupled between the fifth node and the eighth node such that the first and second capacitors operate to provide stability for the class AB turn-around stage.

6. The class AB amplifier of claim 1, wherein the resistive circuit further comprises:
   a thirteenth transistor having a gate terminal that is biased at a first voltage, a source terminal that is coupled to the seventh node, and a drain terminal that is coupled to the twelfth node; and a fourteenth transistor having a gate terminal that is biased to a second voltage, a source terminal that is coupled to the twelfth node, and a drain terminal that is coupled to the seventh node.

7. The class AB amplifier of claim 1, wherein the first, second, third, fourth, fifth, and sixth transistors are NMOS transistors, and the seventh, eighth, ninth, tenth, eleventh, and twelfth transistors are PMOS transistors.

8. The class AB amplifier of claim 1, further comprising:

a differential input stage that is arranged to route a first source current to the second node and a second source current to the third node in response to a differential input signal;

a first output transistor having a gate that is coupled to the seventh node, a source that is coupled to the low power supply, and a drain that is coupled to an output terminal such that the first output transistor pulls current from the output terminal when a first source current is injected into the third node; and a second output transistor having a gate that is coupled to the twelfth node, a source that is coupled to the high power supply, and a drain that is coupled to the output terminal such that the second output transistor pushes current into the output when a second source current is injected into the second node.

9. The class AB amplifier of claim 1, further comprising a feedback loop that includes the first, fourth, fifth, and sixth transistors and is arranged to hold the second node constant when a first source current is injected into the third node.

10. The class AB amplifier of claim 1, further comprising a feedback loop that includes the eighth and tenth transistors and is arranged to hold the tenth node constant when a first source current is injected into the third node.

* * * * *